United States Patent
Akimoto et al.

(10) Patent No.: US 9,557,352 B2
(45) Date of Patent: Jan. 31, 2017

(54) CURRENT DETECTION STRUCTURE

(71) Applicant: Hitachi Metals, Ltd., Tokyo (JP)

(72) Inventors: Katsuya Akimoto, Hitachi (JP); Hisashi Tate, Hitachi (JP); Naofumi Chiwata, Mito (JP); Ken Okuyama, Hitachi (JP); Naoki Futakuchi, Hitachinaka (JP); Yukio Ikeda, Hitachi (JP); Kazuhisa Takahashi, Hitachi (JP); Shinya Hayashi, Hitachi (JP); Takahiro Futatsumori, Mito (JP)

(73) Assignee: HITACHI METALS, LTD., Tokyo (JP)

( * ) Notice: Subject to any disclaimer, the term of this patent is extended or adjusted under 35 U.S.C. 154(b) by 19 days.

(21) Appl. No.: 14/600,814

(22) Filed: Jan. 20, 2015

(65) Prior Publication Data

US 2015/0204919 A1 Jul. 23, 2015

(30) Foreign Application Priority Data

Jan. 21, 2014 (JP) .................................. 2014-008777

(51) Int. Cl.

| G01R 15/20 | (2006.01) |
| G01R 19/15 | (2006.01) |
| G01R 33/00 | (2006.01) |
| G01R 33/02 | (2006.01) |

(52) U.S. Cl.
CPC ............ *G01R 19/15* (2013.01); *G01R 15/207* (2013.01); *G01R 33/0094* (2013.01); *G01R 33/02* (2013.01)

(58) Field of Classification Search
CPC . G01R 15/205; G01R 15/207; G01R 19/0092; G01R 33/093; G01R 19/15; G01R 33/02; G01R 33/0094
See application file for complete search history.

(56) References Cited

U.S. PATENT DOCUMENTS

| 6,472,878 | B1 | 10/2002 | Bruchmann | |
| 2008/0094060 | A1* | 4/2008 | Muraki | B82Y 25/00 324/252 |
| 2009/0021249 | A1 | 1/2009 | Kumar et al. | |
| 2010/0026286 | A1* | 2/2010 | Koss | G01R 15/207 324/244 |
| 2011/0234215 | A1* | 9/2011 | Ausserlechner | G01R 15/20 324/244 |

(Continued)

FOREIGN PATENT DOCUMENTS

| DE | 29804737 U1 * | 5/1998 | ............ G01R 15/20 |
| EP | 2746782 A2 | 6/2014 | |

(Continued)

OTHER PUBLICATIONS

Extended European Search Report dated Jul. 9, 2015.

*Primary Examiner* — Julian Huffman
*Assistant Examiner* — Michael Konczal
(74) *Attorney, Agent, or Firm* — Roberts Mlotkowski Safran Cole & Calderon P.C.

(57) ABSTRACT

A current detection structure includes a plurality of busbars arranged in parallel, and a plurality of magnetic detection elements each provided for corresponding one of the plurality of busbars so as to measure a strength of a magnetic field generated by a current flowing through the corresponding busbar. The plurality of magnetic detection elements are mounted on a single circuit board.

14 Claims, 5 Drawing Sheets

(56) References Cited

U.S. PATENT DOCUMENTS

2013/0320968 A1 12/2013 Sakamoto et al.
2013/0335076 A1 12/2013 Sakamoto et al.
2014/0176124 A1 6/2014 Okumura et al.
2014/0184212 A1 7/2014 Yamaguchi et al.

FOREIGN PATENT DOCUMENTS

| | | |
|---|---|---|
| JP | 2010-008315 | 1/2010 |
| JP | 2013013169 A | 1/2013 |
| JP | 2013-170878 | 9/2013 |
| WO | 2013031291 A1 | 3/2013 |

* cited by examiner

CURRENT DETECTION STRUCTURE

The present application is based on Japanese patent application No. 2014-008777 filed on Jan. 21, 2014, the entire contents of which are incorporated herein by reference.

BACKGROUND OF THE INVENTION

1. Field of the Invention

The invention relates to a current detection structure.

2. Description of the Related Art

A magnetic detection element is used for detecting the strength of a magnetic field generated by a current flowing through a busbar. From the magnetic field strength detected by the magnetic detection element, it is possible to derive the current flowing through the busbar by calculation.

MR (Magneto Resistance) sensors and GMR (Giant Magneto Resistive effect) sensors are known as the magnetic detection element.

In detecting each current flowing through plural busbars e.g. when detecting a current in each phase of a three-phase motor, it is necessary to install a magnetic detection element on each busbar to be detected.

Prior art related to the invention of the present application may include e.g. JP-B-5153481 and JP-A-2013-170878.

SUMMARY OF THE INVENTION

It is necessary to accurately align the magnetic detection element with the busbar so as to provide a current detection structure with a high detection accuracy.

Since plural magnetic detection elements are each mounted on a separate substrate in the current detection structure, the alignment with the busbar is required for each magnetic detection element. Thus, a problem may arise that the assembly takes time and the manufacturing cost increases.

It is an object of the invention to provide a current detection structure with improved assemblability.

(1) According to one embodiment of the invention, a current detection structure comprises:

a plurality of busbars arranged in parallel; and a plurality of magnetic detection elements each provided for corresponding one of the plurality of busbars so as to measure a strength of a magnetic field generated by a current flowing through the corresponding busbar, wherein the plurality of magnetic detection elements are mounted on a single circuit board.

In the above embodiment (1) of the invention, the following modifications and changes can be made.

(i) The plurality of magnetic detection elements are mounted on a same surface of the circuit board.

(ii) The plurality of magnetic detection elements are arranged in a line on the circuit board.

(iii) The plurality of busbars are arranged in contact with the circuit board.

(iv) An alignment mark indicating a position for arranging the plurality of busbars is formed on the circuit board.

(v) An alignment protrusion for aligning the busbars with respect to the circuit board is formed on the circuit board so as to be in contact with a sidewall of the busbars or an inner wall of a hole formed in the busbars.

(vi) A clip for locking the busbars is formed at a tip of the alignment protrusion.

(vii) A through-hole is formed penetrating the busbars, and wherein the magnetic detection elements are arranged in the through-hole.

(viii) The current detection structure further comprises a resin housing or a resin mold that is formed to cover the magnetic detection elements, the busbars and the circuit board around the magnetic detection elements.

(ix) A groove for receiving the magnetic detection elements is formed in the circuit board.

Effects of the Invention

According to one embodiment of the invention, a current detection structure with improved assemblability can be provided.

BRIEF DESCRIPTION OF THE DRAWINGS

Next, the present invention will be explained in more detail in conjunction with appended drawings, wherein:

FIGS. 1A and 1B are diagrams illustrating a current detection structure in an embodiment of the present invention, wherein FIG. 1A is a perspective view and FIG. 1B is a cross sectional view taken on line 1B-1B in FIG. 1A;

DETAILED DESCRIPTION OF THE PREFERRED EMBODIMENT

An embodiment of the invention will be described below in conjunction with the appended drawings.

Figure 1A:
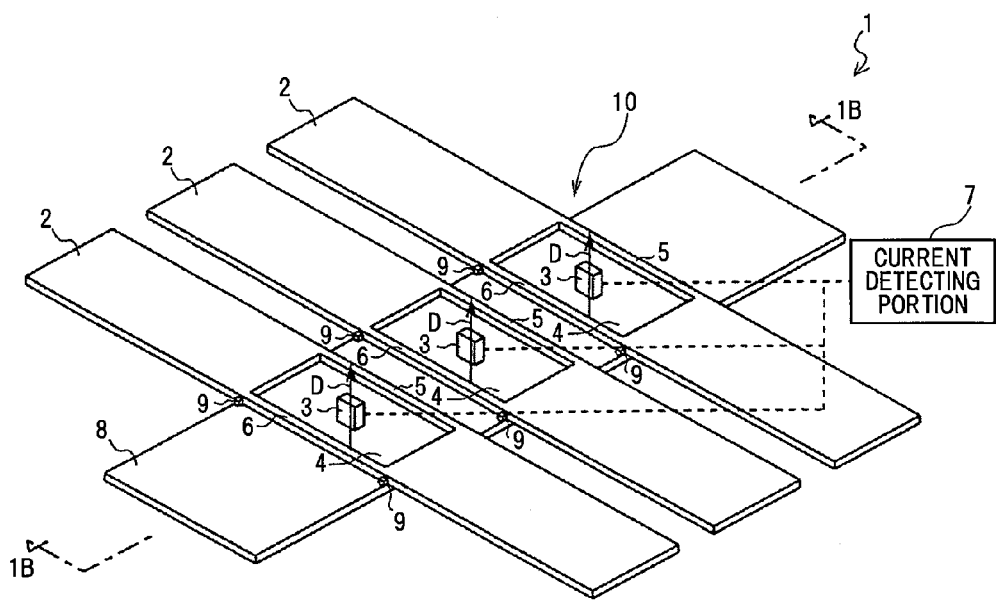
Figure 1B:
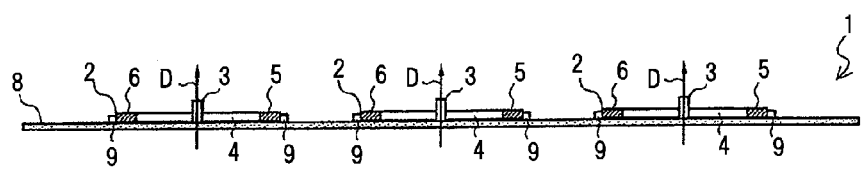
Figure 2:
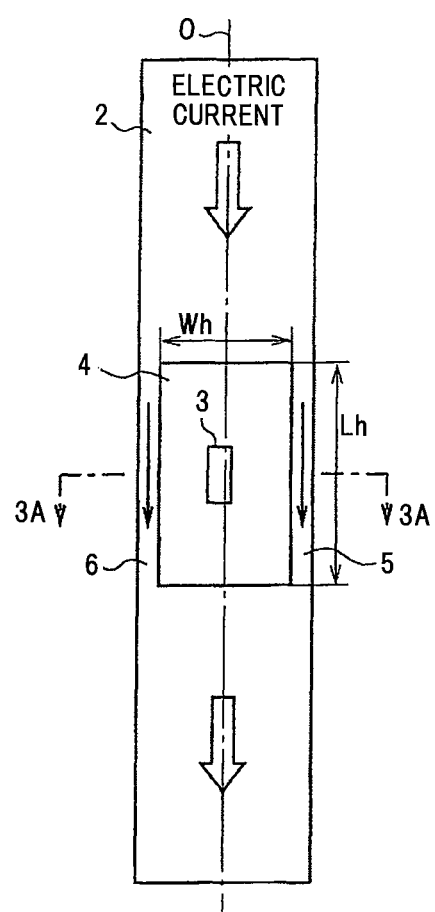
FIG. 2 is an explanatory plan view showing relative positions of a busbar and a magnetic detection element in the current detection structure of FIGS. 1A and 1B.

FIGS. 1A and 1B are diagrams illustrating a current detection structure in the present embodiment, wherein FIG. 1A is a perspective view and FIG. 1B is a cross sectional view taken on line 1B-1B in FIG. 1A.

As shown in FIGS. 1A and 1B, a current detection structure 1 is provided with plural busbars 2 arranged in parallel and plural magnetic detection elements 3 provided one each for the plural busbars 2 to measure strength of a magnetic field generated by a current flowing through the corresponding busbar 2. Hereinafter, a portion in which the magnetic detection elements 3 are provided is called a detecting portion 10.

The structure described herein is provided with three busbars 2 for carrying three-phase alternating currents and uses three magnetic detection elements 3 to detect currents flowing through the respective busbars 2. The busbar 2 is a current path between, e.g., an inverter and a motor in a vehicle.

The busbar 2 is a plate-shaped conductor and serves as a current path for carrying a current. The current flowing through the busbar 2 is, e.g., up to about 200 A in a steady state and up to about 800 A as inrush current in an abnormal state, etc., and has a frequency of, e.g., up to about 100 kHz.

The three busbars 2 are arranged in a line in the same plane at equal intervals in a width direction thereof so that the respective longitudinal directions are parallel.

The magnetic detection element 3 is configured to output a voltage output signal according to magnetic field strength (magnetic flux density) in a direction along a detection axis D. In the present embodiment, a GMR sensor having a high sensitivity is used as the magnetic detection element 3.

The current detection structure 1 is also provided with a current detecting portion 7. The current detecting portion 7 is to detect currents flowing through the busbars 2 based on magnetic field strength detected by the magnetic detection elements 3. The current detecting portion 7 is provided on, e.g., an ECU (Electronic Control Unit) of a vehicle.

In the current detection structure 1 of the present embodiment, the plural magnetic detection elements 3 (three in the embodiment) are mounted on one circuit board 8. Although FIG. 1A illustrates as if the magnetic detection elements 3 are directly connected to the current detecting portion 7 for convenience, the magnetic detection elements 3 and the current detecting portion 7 are, in fact, connected via a wiring pattern formed on the circuit board 8.

Mounting all the magnetic detection elements 3 on one circuit board 8 makes assembly easier than the case where each magnetic detection element 3 is mounted on a separate circuit board. In addition, in a state that, for example, each busbar 2 is preliminarily relatively positioned and fixed, it is possible to align all magnetic detection elements 3 with the busbars 2 only by alignment with respect to one circuit board 8 and this allows alignment work to be easily carried out.

The plural magnetic detection elements 3 are mounted on the circuit board 8 desirably on the same surface. This is because, when the magnetic detection elements 3 are mounted on the both surfaces of the circuit board 8, it is necessary to mount magnetic detection elements 3 on one surface and then to mount other magnetic detection elements 3 on another surface and it takes time and effort to mount the magnetic detection elements 3.

The plural magnetic detection elements 3 are arranged in a line on the circuit board 8 at equal intervals. In the present embodiment, the circuit board 8 formed in a long shape is arranged so that the longitudinal direction of the circuit board 8 is orthogonal to the longitudinal direction of the busbar 2, and the magnetic detection elements 3 are arranged in a line on the circuit board 8 along the longitudinal direction of the circuit board 8 at equal intervals. Each magnetic detection element 3 is arranged so that the detection axis D thereof is perpendicular to the surface of the circuit board 8. The shape of the circuit board 8 is not limited to the shape described above and the magnetic detection elements 3 may not be spaced at equal intervals.

In the current detection structure 1, the plural busbars 2 are arranged in contact with the circuit board 8. In the present embodiment, a through-hole 4 is formed on the busbar 2 so as to penetrate therethrough and the magnetic detection element 3 is arranged in the through-hole 4. That is, in the current detection structure 1, the busbars 2 are arranged on the surface of the circuit board 8 on which the magnetic detection elements 3 are mounted. This allows the busbars 2 and the magnetic detection elements 3 to be all arranged on one side of the circuit board 8 and it is thus possible to downsize (to thin) the detecting portion 10.

The through-hole 4 needs to be larger than the magnetic detection element 3 in order to arrange the magnetic detection element 3 in the through-hole 4. By forming the through-hole 4 larger than the magnetic detection element 3, it is possible to align the busbar 2 while visually checking the magnetic detection element 3.

The magnetic detection element 3 is arranged so that the detection axis D thereof is along a thickness direction of the busbar 2. In other words, the magnetic detection element 3 is arranged so that the detection axis D thereof is orthogonal to the surface of the busbar 2. When the magnetic detection element 3 is a GMR sensor, the magnetic detection element 3 has two or more detection axes and one specific axis is perpendicular to the surface of the busbar 2. The detection axis D of the magnetic detection element 3 may be inclined about −10° to 10° with respect to a direction orthogonal to the surface of the busbar 2.

The through-hole 4 is formed in the middle of the busbar 2 so as to penetrate therethrough and is thus surrounded by the busbar 2. In other words, the through-hole 4 is not a cutout which partially opens to a lateral side of the busbar 2. By forming such a through-hole 4, current paths 5 and 6 are formed on the both sides of the through-hole 4.

Since the current paths 5 and 6 are formed on the both sides of the through-hole 4 as shown in FIGS. 1A to 3, magnetic field components in a thickness direction generated by the two current paths 5 and 6 cancel each other out in the through-hole 4. Here, what the magnetic detection element 3 arranged in the through-hole 4 detects is strength of a synthetic magnetic field produced by combining magnetic fields respectively generated by currents flowing through the current paths 5 and 6 on the both sides of the through-hole 4, i.e., strength of the magnetic fields generated in the current paths 5 and 6 and then cancelled each other out. Therefore, by adjusting a position of the magnetic detection element 3, the degree of cancellation can be controlled and strength of the magnetic field to be detected can be thereby adjusted to the optimum level.

Then, the current detecting portion 7 detects a current flowing through each busbar 2 based on magnetic field strength which is the strength of the synthetic magnetic field produced by combining magnetic fields respectively generated by currents flowing through the current paths 5 and 6 on the both sides of the through-hole 4 and is detected by the magnetic detection element 3.

That is, in the current detection structure 1, the magnetic detection element 3 can detect the magnetic field with appropriate strength even when the current flowing through the busbar 2 is high and strength of magnetic field generated by each of the current paths 5 and 6 is large since the large magnetic fields cancel each other out. Therefore, a highly sensitive GMR sensor, etc., can be used as the magnetic detection element 3 for measurement.

In case of using the GMR sensor as the magnetic detection element 3, it is desirable that the magnetic detection element 3 be arranged at a position where a magnetic flux density of the synthetic magnetic field produced by combining magnetic fields generated in the current paths 5 and 6 is more than 0 and not more than 5 mT. This is because output of a general GMR sensor is saturated at a magnetic flux density of more than 5 mT and it makes measurement difficult. The magnetic flux density here is the magnitude in a steady state and the case of temporality exceeding 5 mT in an abnormal state or a transient state is taken as an exception.

More desirably, the magnetic detection element 3 be arranged at a position where a magnetic flux density of the synthetic magnetic field produced by combining magnetic fields generated in the current paths 5 and 6 (the magnetic flux density in a steady state) is more than 0 and not more than 2 mT since a range in which the magnetic flux density can be accurately detected (a range in which the magnetic flux density and output voltage are linear) is generally not more than 2 mT in the GMR sensor.

Arranging the magnetic detection element 3 in the through-hole 4 herein means that at least a portion of the magnetic detection element 3 is housed in the through-hole 4, in other words, at least a portion of the magnetic detection element 3 overlaps the busbar 2 as viewed on a horizontal cross section (or as viewed from a side). It is possible to downsize (to thin) the detecting portion 10 by arranging the magnetic detection element 3 in the through-hole 4.

Currents with a component in a width direction flow in the vicinity of longitudinal end portions of the through-hole 4, which causes an error. Therefore, it is desirable to arrange the magnetic detection element 3 at a position spaced from the longitudinal end portions of the through-hole 4 so as not to be affected by the currents with a component in a width direction, and it is preferable to arrange the magnetic detection element 3 at the center of the through-hole 4 in the longitudinal direction of the busbar 2. Taking the magnitude of the current flowing through the busbar 2, etc., into calculation, a length Lh of the through-hole 4 is determined so that the magnetic detection element 3 can be arranged at a position not affected by magnetic fields generated in the vicinity of the longitudinal end portions of the through-hole 4.

In present embodiment, the though-hole 4 is formed to have a symmetrical shape with respect to a central axis O of the busbar 2 and the current paths 5 and 6 are formed symmetrically on the both sides of the though-hole 4. By such a configuration, magnetic fields are generated symmetrically from the current paths 5 and 6.

Figure 3:
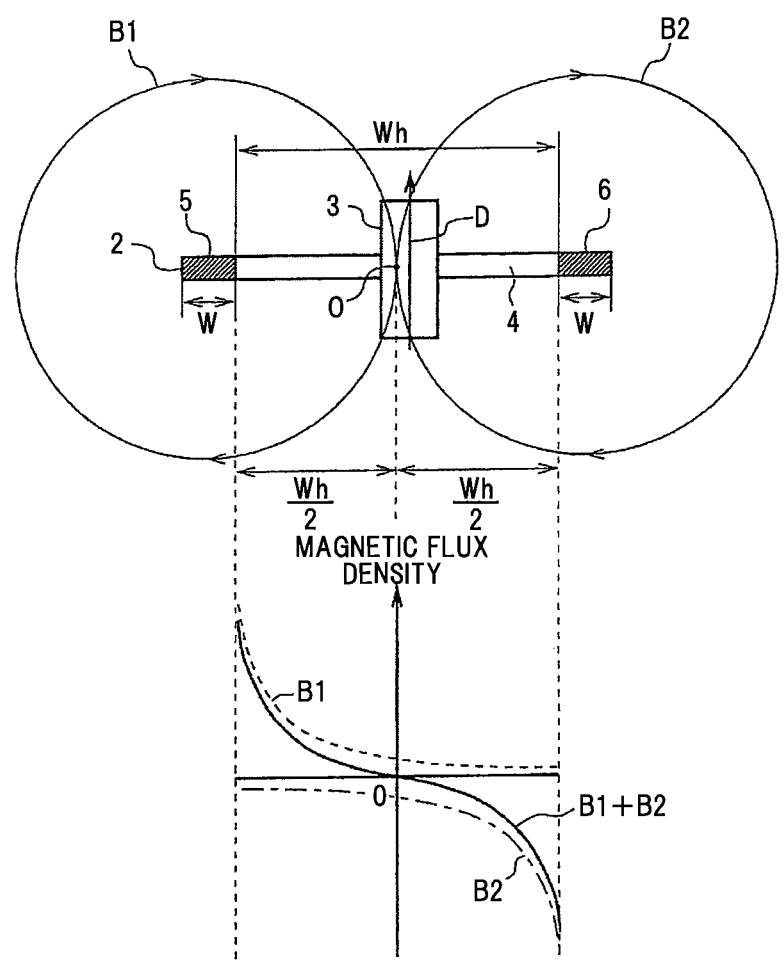
FIG. 3 is a cross sectional view taken on line 3A-3A in FIG. 2 and a diagram illustrating magnetic flux density distribution on the 3A-3A line cross section.

As shown in FIG. 3, in the though-hole 4, distribution of a magnetic flux density B1 generated by the current path 5 and distribution of a magnetic flux density B2 generated by the current path 6 are substantially inversely proportional to distances from the current paths 5 and 6 and directions of the magnetic flux densities B1 and B2 generated by the current paths 5 and 6 are opposite to each other. By symmetrically forming the current paths 5 and 6 on the both sides of the though-hole 4, the magnetic fields generated in the two current paths 5 and 6 completely cancel each other out on the central axis O of the busbar 2, resulting in magnetic flux density (B1+B2) of 0. In the graph of FIG. 3, distribution of the magnetic flux density B1 which is generated by the current path 5 shown on the left side of the drawing is indicated by a thin dotted line, distribution of the magnetic flux density B2 which is generated by the current path 6 shown on the right side of the drawing is indicated by a thin dash-dot line, and distribution of the magnetic flux density (B1+B2) produced by combining the magnetic flux densities generated by the two current paths 5 and 6 is indicated by a thick solid line.

Therefore, the magnetic detection element 3 when arranged at an appropriate position off the central axis O of the busbar 2 can detect the optimal level of magnetic flux density (B1+B2) and it is thus possible to carry out measurement with high accuracy. Arranging the magnetic detection element 3 at a position off the central axis O of the busbar 2 here means that the center of the magnetic detection element 3 in the width direction of the busbar 2 is shifted from the central axis O in the width direction. Therefore, a portion of the magnetic detection element 3 may be on the central axis O.

In addition, in the current detection structure 1, the distribution of the magnetic flux density (B1+B2) produced by combining the magnetic flux densities generated by the two current paths 5 and 6 is relatively close to flat in the vicinity of the central axis O of the busbar 2, which allows an error due to disturbance to be reduced and provides excellent robustness. Since the distribution of the magnetic flux density (B1+B2) in the vicinity of the central axis O becomes flatter with an increase in a width Wh of the through-hole 4, the width Wh of the through-hole 4 is desirably as large as possible from the viewpoint of improving the robustness.

Preferably, taking the frequency of the current flowing through the busbar 2 into calculation, a width W of the current paths 5 and 6 is determined so that the influence of the skin effect can be suppressed. Since a skin depth at a frequency of 100 kHz is about 0.2 mm when using copper or copper alloy for the busbar 2, the width W of the current paths 5 and 6 in the present embodiment is desirably not more than 0.5 mm, more desirably not more than 0.2 mm. At a frequency of 10 kHz, the skin depth is about 1 mm and the width W of the current paths 5 and 6 in such a case is desirably not more than 2 mm, more desirably not more than 1 mm.

In this regard, however, if the width W of the current paths 5 and 6 is reduced too much, resistance is increased due to a decrease in the cross sectional area of the current paths 5 and 6, resulting in increases in loss and heat generation. Therefore, the width W of the current paths 5 and 6 and the width Wh of the through-hole 4 should be appropriately set in view of the influence of the skin effect and acceptable loss and heat generation, etc.

Preferably, also taking the frequency of the current flowing through the busbar 2 into calculation, a thickness of the current paths 5 and 6 is determined so that the influence of the skin effect can be suppressed. When copper or copper alloy is used for the busbar 2 and the frequency of the current flowing through the busbar 2 is not more than 100 kHz, the thickness of the current paths 5 and 6 is desirably not more than 0.5 mm, more desirably not more than 0.2 mm. Meanwhile, when the frequency of the current flowing through the busbar 2 is not more than 10 kHz, the thickness of the current paths 5 and 6 is desirably not more than 2 mm, more desirably not more than 1 mm.

In the present embodiment, the though-hole 4 is formed to have a symmetrical shape with respect to the central axis O of the busbar 2 and the current paths 5 and 6 are formed symmetrically on the both sides of the though-hole 4. However, the current paths 5 and 6 on the both sides of the though-hole 4 may be formed asymmetrically or the though-hole 4 may have an asymmetrical shape. When, for example, the width W of one of the current paths 5 and 6 is larger than the width W of the other, it is possible to arrange the magnetic detection element 3 on the central axis O of the busbar 2 or on the widthwise center of the though-hole 4. However, the width W of the current path 5 and that of the current path 6 need to be adjusted so as not to be significantly different from each other since, if the difference therebetween is increased, reverse current, etc., occurs and causes an error.

In addition, in case that the current paths 5 and 6 are formed asymmetrically or the though-hole 4 has an asymmetrical shape, a difference between currents flowing through the two current paths 5 and 6 is generated and causes a difference in strength between magnetic fields generated in the two current paths 5 and 6. This causes the magnetic flux density distribution to be uneven unlike the uniform distribution shown in FIG. 3, which may cause susceptibility to disturbance in a specific direction. Therefore, from the viewpoint of increasing the robustness, the though-hole 4 formed to have a symmetrical shape with respect to the central axis O of the busbar 2 and the current paths 5 and 6 formed symmetrically on the both sides of the though-hole 4 are more desirable.

In addition, although the though-hole 4 in the present embodiment is formed in a rectangular shape in a plan view, the shape of the though-hole 4 is not limited thereto and the though-hole 4 may have, e.g., an ellipse shape or a polygonal shape. In case that the though-hole 4 is formed in an ellipse shape or a polygonal shape, however, currents with a component in a width direction are generated in the current paths 5 and 6 and cause an error. Therefore, the current paths 5 and 6 linearly formed on the both sides of the though-hole 4 along the longitudinal direction of the busbar 2 are more preferable.

Next, a structure to facilitate alignment of the busbar 2 with respect to the circuit board 8 will be described. Misalignment between the busbar 2 and the magnetic detection element 3 causes an error. Therefore, in the current detection structure 1, desired relative positions of the busbar 2 and the magnetic detection element 3, i.e., desired relative positions of the circuit board 8 and the busbar 2 need to be maintained and accurate alignment is required.

In the present embodiment, the plural busbars 2 are arranged in contact with the circuit board 8, as described above. The busbar 2 and the magnetic detection element 3 are aligned in a thickness direction of the busbar 2 since the busbars 2 is arranged in contact with the circuit board 8.

On a surface of the circuit board 8 on which the busbars 2 are arranged, alignment marks indicating positions for arranging the plural busbars 2 are desirably formed to facilitate alignment of the busbars 2 with respect to the circuit board 8.

In the present embodiment, alignment protrusions 9 are formed on the circuit board 8 so as to vertically protrude from the surface of the circuit board 8, instead of forming the alignment marks. The alignment protrusions 9 are in contact with sidewalls of the busbar 2 to restrict a widthwise movement of the busbar 2, thereby aligning the busbar 2 with respect to the circuit board 8.

Although four alignment protrusions 9 in total, two each on both sides of the busbar 2, are formed in the present embodiment, the number of the alignment protrusions 9 is not limited thereto. However, it is desirable to form at least two or more alignment protrusions 9 in order to accurately align the busbar 2.

Figure 4A:
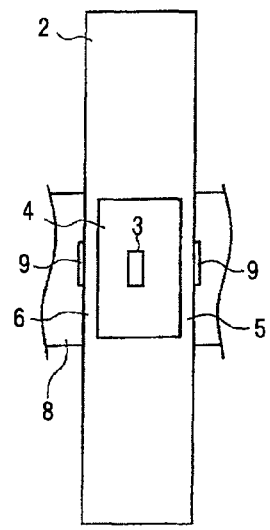
FIGS. 4A to 4E are plan views showing current detection structures in modifications of the invention.

In case of providing two alignment protrusions 9, each alignment protrusion 9 is desirably formed in a rib shape by increasing length thereof (length along the longitudinal direction of the busbar 2) to some extent as shown in FIG. 4A to suppress twisting misalignment of the busbar 2 in a plane parallel to the surface of the busbar 2. Alternatively, two alignment protrusions 9 may be formed at different positions in the longitudinal direction of the busbar 2 so that the busbar 2 is sandwiched therebetween, as shown in FIG. 4E. This allows the twisting misalignment of the busbar 2 to be suppressed without increasing the length of the alignment protrusion 9.

Figure 4B:
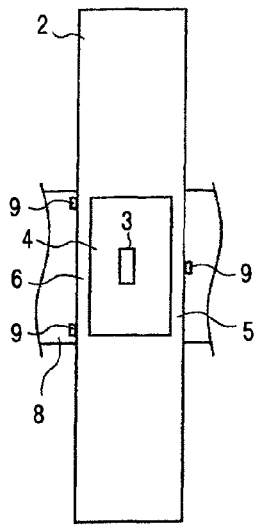

Meanwhile, in case of providing three alignment protrusions 9, two alignment protrusions 9 are formed on one side of the busbar 2 so as to be spaced from each other and one alignment protrusion 9 is formed on another side of the busbar 2 at a position corresponding to the middle of the two alignment protrusions 9 in the longitudinal direction of the busbar 2, as shown in FIG. 4B.

Figure 4C:
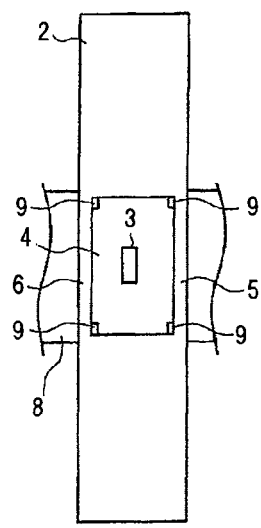
Figure 4D:
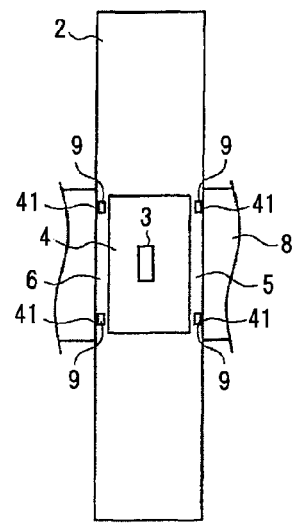
Figure 4E:
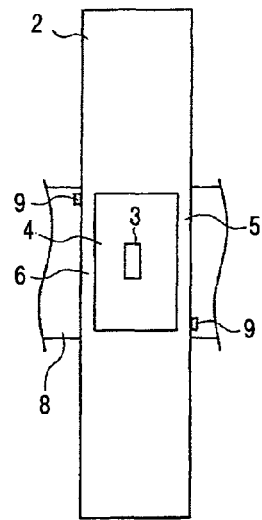

In the present embodiment, the alignment protrusions 9 are formed so as to be in contact with the sidewalls of the busbar 2 but it is not limited thereto. The alignment protrusions 9 may be formed so as to be in contact with an inner wall of a hole (including a notch) formed on the busbar 2. In the present embodiment, the through-hole 4 is formed on the busbar 2 and thus can be used such that the alignment protrusions 9 are in contact with the inner wall of the through-hole 4, as shown in FIG. 4C. Alternatively, notches 41 may be formed on both sides of the busbar 2 so that the alignment protrusions 9 are in contact with the inner walls of the notches 41.

It is possible to suppress misalignment of the busbar 2 in the longitudinal direction thereof by forming the alignment protrusions 9 so as to be in contact with the inner wall of the hole formed on the busbar 2, thereby allowing for more accurate alignment.

Figure 5A:
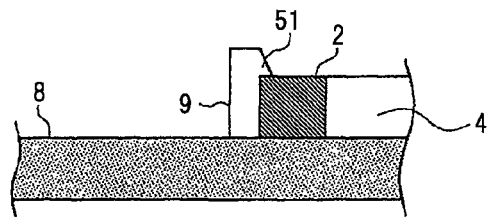
FIGS. 5A and 5B are cross sectional views showing current detection structures in modifications of the invention.

Furthermore, as shown in FIG. 5A, a clip 51 for locking the busbar 2 may be formed at a tip of the alignment protrusion 9. It is possible to hold the busbar 2 more securely by providing the clip 51 and thereby to suppress the misalignment of the busbar 2.

Figure 5B:
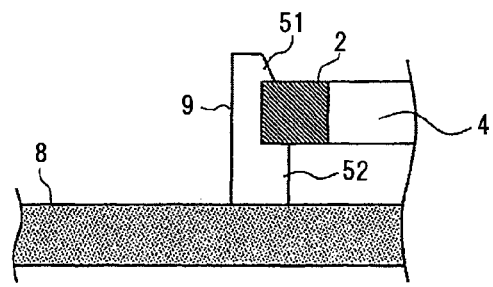

In addition, although each busbar 2 is in contact with the circuit board 8 in the present embodiment, the busbar 2 may be supported by the circuit board 8 via a spacer portion 52 formed at an end portion of the alignment protrusion 9 on the circuit board 8 side, as shown in FIG. 5B. Although the spacer portion 52 is integrally formed with the alignment protrusion 9 in this modification, a spacer may be separately formed from the alignment protrusion 9. Alternatively the spacer may be formed on the busbar 2.

When providing a spacer such as the spacer portion 52, it is possible to adjust the relative positions of the busbar 2 and the magnetic detection element 3 in the thickness direction by adjusting a height of the spacer, and this allows the magnetic detection element 3 to be arranged so that the center thereof (the center of the magnetic detection element 3 in the thickness direction of the busbar 2) coincides with the center of the busbar 2 in the thickness direction thereof. Thus, when the GMR sensor is used as the magnetic detection element 3, the magnetic fields enter the magnetic detection element 3 only in a direction parallel to the detection axis D of the magnetic detection element 3 and this allows currents to be easily detected with high accuracy.

A resin housing or a resin mold is formed to cover the magnetic detection element 3 and also to cover the busbar 2 and the circuit board 8 around the magnetic detection element 3 even though it is not shown in the drawings. Especially when forming the resin mold, it is necessary to mold a resin after accurately aligning the magnetic detection element 3 with the busbar 2. In such a case, the effect of providing the alignment protrusions 9 is significant. In addition, by forming the alignment protrusions 9 and the clips 51, it is possible to reduce misalignment of the busbar 2 with respect to the magnetic detection element 3 due to pressure of resin at the time of forming the resin mold.

In the current detection structure 1 of the present embodiment, plural magnetic detection elements 3 are mounted on one circuit board 8, as described above. This makes assembly easier and the manufacturing cost less than the case where plural magnetic detection elements 3 are mounted on separate circuit boards.

The invention is not intended to be limited to the embodiment, and it is obvious that the various kinds of modification can be implemented without departing from the gist of the present invention.

Figure 6A:
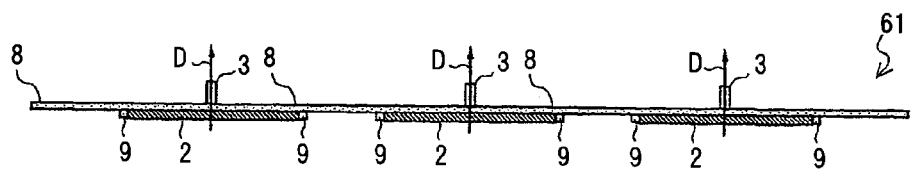
FIGS. 6A and 6B are cross sectional views showing current detection structures in modifications of the invention.

For example, although the busbars 2 in the present embodiment are arranged on the surface of the circuit board 8 on which the magnetic detection elements 3 are mounted, it is not limited thereto. The busbars 2 may be arranged on a surface of the circuit board 8 opposite to the surface mounting the magnetic detection elements 3, as is a current detection structure 61 shown in FIG. 6A. In this case, it is possible to eliminate the through-hole 4 when a current flowing through the busbar 2 and strength of the magnetic field to be detected by the magnetic detection element 3 are small (i.e., when the strength of the magnetic field is suitable for detection by a GMR sensor), which allows the cost to be further reduced.

Figure 6B:
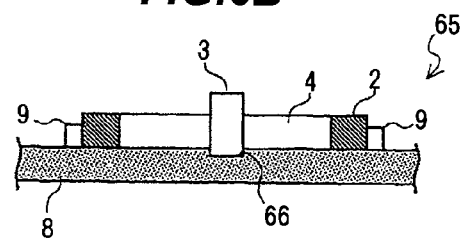

In addition, grooves 66 for housing the magnetic detection elements 3 may be formed on the circuit board 8, as is a current detection structure 65 shown in FIG. 6B. By forming the grooves 66, it is possible to further reduce the thickness of the detecting portion 10 and also to suppress tilt of the magnetic detection element 3 due to pressure of resin at the time of forming the resin mold.

What is claimed is:

1. A current detection structure, comprising:
    a plurality of busbars arranged in parallel;
    a plurality of magnetic detection elements each provided for a corresponding one of the plurality of busbars so as to measure a strength of a magnetic field generated by a current flowing through the corresponding busbar, wherein the plurality of magnetic detection elements are mounted at positions off central axes of each of the plurality of busbars on a single circuit board, and
    a source of three-phase alternating current, wherein different phases of the three-phase alternating current are connected to different ones of the busbars.

2. The current detection structure according to claim 1, wherein the plurality of magnetic detection elements are mounted on a same surface of the circuit board.

3. The current detection structure according to claim 2, wherein the plurality of magnetic detection elements are arranged in a line on the circuit board.

4. The current detection structure according to claim 1, wherein the plurality of busbars are arranged in contact with the circuit board.

5. The current detection structure according to claim 4, wherein an alignment mark indicating a position for arranging the plurality of busbars is formed on the circuit board.

6. The current detection structure according to claim 1, wherein an alignment protrusion for aligning the busbars with respect to the circuit board is formed on the circuit board so as to be in contact with a sidewall of the busbars or an inner wall of a hole formed in the busbars.

7. The current detection structure according to claim 6, wherein a clip for locking the busbars is formed at a tip of the alignment protrusion.

8. The current detection structure according to claim 1, wherein a through-hole is formed penetrating the busbars, and wherein the magnetic detection elements are arranged in the through-hole.

9. The current detection structure according to claim 1, further comprising a resin housing or a resin mold that is formed to cover the magnetic detection elements, the busbars and the circuit board around the magnetic detection elements.

10. The current detection structure according to claim 1, wherein a groove for receiving the magnetic detection elements is formed in the circuit board.

11. The current detection structure according to claim 1, wherein a though-hole is formed to have a symmetrical shape with respect to a central axis O of each busbar.

12. The current detection structure according to claim 1, wherein a resin housing or a resin mold is formed to cover the plurality of magnetic detection elements and to cover at least partially the plurality of busbars.

13. The current detection structure according to claim 12, wherein the resin housing or the resin mold covers portions of the plurality of busbars around the plurality of magnetic detection elements.

14. The current detection structure according to claim 1, wherein each of the magnetic detection elements has a central axis, and wherein the central axis of each of the plurality of magnetic detection elements is mounted offset from the central axis of its respective busbar.

* * * * *